US011336241B2

United States Patent
Kawamura et al.

(10) Patent No.: US 11,336,241 B2
(45) Date of Patent: May 17, 2022

(54) HIGH-FREQUENCY AMPLIFIER, ELECTRONIC DEVICE, AND COMMUNICATION DEVICE

(71) Applicant: SONY SEMICONDUCTOR SOLUTIONS CORPORATION, Kanagawa (JP)

(72) Inventors: Takashi Kawamura, Kanagawa (JP); Masahiro Sato, Tokyo (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/766,282

(22) PCT Filed: Sep. 12, 2018

(86) PCT No.: PCT/JP2018/033733
§ 371 (c)(1),
(2) Date: May 21, 2020

(87) PCT Pub. No.: WO2019/106909
PCT Pub. Date: Jun. 6, 2019

(65) Prior Publication Data
US 2021/0265961 A1 Aug. 26, 2021

(30) Foreign Application Priority Data

Nov. 30, 2017 (JP) .............................. JP2017-229882

(51) Int. Cl.
*H04B 1/40* (2015.01)
*H03F 3/24* (2006.01)
(Continued)

(52) U.S. Cl.
CPC .............. *H03F 3/245* (2013.01); *H03F 1/56* (2013.01); *H04B 1/40* (2013.01);
(Continued)

(58) Field of Classification Search
None
See application file for complete search history.

(56) References Cited

U.S. PATENT DOCUMENTS 6,999,290 B1 * 2/2006 Takikawa ............ H01L 27/0255
361/119
7,482,875 B2 * 1/2009 Tanoue ..................... H03F 1/26
330/277
(Continued)

FOREIGN PATENT DOCUMENTS

JP 57-057014 A 4/1982
JP 02-079607 A 3/1990
(Continued)

OTHER PUBLICATIONS

International Search Report and Written Opinion of PCT Application No. PCT/JP2018/033733, dated Nov. 27, 2018, 10 pages of ISRWO.

*Primary Examiner* — Pablo N Tran
(74) *Attorney, Agent, or Firm* — Chip Law Group (57) ABSTRACT

Provided is a high-frequency amplifier capable of making a circuit substrate small and reducing a cost. A high-frequency amplifier is provided with a first substrate including a matching unit, and a second substrate including a transistor and a first impedance converter connected to each other, in which the matching unit of the first substrate and the first impedance converter are connected to each other via a first connection. Furthermore, the high-frequency amplifier is further provided with a third substrate including a matching unit, in which the second substrate may further include a second impedance converter connected to the transistor, and the second impedance converter and the matching unit of the third substrate may be connected to each other via a second connection.

11 Claims, 9 Drawing Sheets

(51) Int. Cl.
*H03F 1/56* (2006.01)
*H03F 3/195* (2006.01)
*H03F 3/60* (2006.01)

(52) U.S. Cl.
CPC .. *H03F 2200/222* (2013.01); *H03F 2200/387* (2013.01); *H03F 2200/451* (2013.01)

(56) References Cited

U.S. PATENT DOCUMENTS

| | | | | |
|---|---|---|---|---|
| 7,508,269 | B2* | 3/2009 | Fukuda | H03F 1/56 330/302 |
| 7,541,874 | B2* | 6/2009 | Maeda | H03F 1/565 330/296 |
| 9,331,664 | B2* | 5/2016 | Bouisse | H03F 3/19 |
| 9,490,208 | B2* | 11/2016 | Nishijima | H03F 1/565 |
| 10,411,658 | B2* | 9/2019 | Seshita | H03F 3/211 |
| 2010/0079211 | A1* | 4/2010 | Matsuda | H03H 7/383 330/306 |
| 2019/0326857 | A1* | 10/2019 | Tanaka | H03F 1/0211 |

FOREIGN PATENT DOCUMENTS

| | | |
|---|---|---|
| JP | 04-287507 A | 10/1992 |
| JP | 06-005794 A | 1/1994 |
| JP | 08-293746 A | 11/1996 |
| JP | 2002-064346 A | 2/2002 |
| JP | 2005-295193 A | 10/2005 |
| JP | 2014-120582 A | 6/2014 |
| JP | 2017-055224 A | 3/2017 |

\* cited by examiner

HIGH-FREQUENCY AMPLIFIER, ELECTRONIC DEVICE, AND COMMUNICATION DEVICE

CROSS REFERENCE TO RELATED APPLICATIONS

This application is a U.S. National Phase of International Patent Application No. PCT/JP2018/033733 filed on Sep. 12, 2018, which claims priority benefit of Japanese Patent Application No. JP 2017-229882 filed in the Japan Patent Office on Nov. 30, 2017. Each of the above-referenced applications is hereby incorporated herein by reference in its entirety.

TECHNICAL FIELD

The present technology relates to a high-frequency amplifier, an electronic device, and a communication device, and especially relates to a technology of a high-frequency amplifier having a configuration of matching impedance.

BACKGROUND ART

In a front-end circuit that is a transmission/reception end circuit on an antenna side for fifth-generation mobile communication system (5G) developed in recent years, a power amplifier (PA) for 5G including a matching circuit up to 50Ω), for example, is mounted on a semiconductor chip of a GaAs substrate, GaN substrate and the like.

Since such power amplifier consumes a large amount of power, high efficiency is important from the viewpoint of reducing power consumption and suppressing heat generation. Especially, at a high frequency (for example, 28 GHz and the like) used in 5G, performance of a transistor is deteriorated, so that it is more important to improve efficiency of the power amplifier. However, since a matching unit that converts input/output impedance of the transistor to input/output impedance of the amplifier (generally 50Ω) is in the semiconductor chip and occupies most of a chip size, the matching circuit is large in size, and a cost might increase in a case where an expensive material such as GaN substrate considered to be of higher performance is used.

As a method of reducing the cost by reducing the semiconductor chip size, for example, it is known to form the matching circuit on a separate substrate and adjust variation in wire and bump used as a connection between the separate substrate and the semiconductor chip.

Here, as an example of a technology of adjusting the variation in wire of the semiconductor chip, Patent Document 1 discloses a microwave amplifier of an integrated circuit including an input matching circuit and an output matching circuit formed on a dielectric substrate, and a transistor that amplifies a signal from the input matching circuit to output to the output matching circuit, in which an inductive reactance circuit connected to a ground terminal of the transistor includes a strip conductor provided so as to be perpendicular to a microwave propagation direction and a metal fine wire on the dielectric substrate.

Furthermore, Patent Document 2 discloses a microwave amplifier provided with a transistor with matching circuits connected an input side and an output side, and a pre-matching circuit inserted between the transistor and the matching circuit on the input side, in which characteristic impedance and a line length are set such that the characteristic impedance of and the line length of the pre-matching circuit satisfies a predetermined relationship.

Furthermore, Patent Document 3 discloses a high-frequency semiconductor device provided with a mounting member including a semiconductor element provided with a microwave integrated circuit, a metal plate to which the semiconductor element is joined, an insulator frame surrounding the semiconductor element and joined to the metal plate, and a first transmission line provided on the insulator frame and having characteristic impedance of 50Ω, a relay substrate including a second transmission line arranged on the metal plate between the semiconductor element and the first transmission line and having characteristic impedance of 50Ω, and a capacitive stub arranged separately from the second transmission line and capable of being connected to a central portion of the second transmission line, a first bonding wire connecting an inner end of the first transmission line and a first end of the second transmission line, and a second bonding wire connecting a first electrode of the semiconductor element and a second end on a side opposite to the first end of the second transmission line.

CITATION LIST

Patent Document

Patent Document 1: Japanese Patent Application Laid-Open No. H02-079607
Patent Document 2: Japanese Patent Application Laid-Open No. 2002-064346
Patent Document 3: Japanese Patent Application Laid-Open No. 2017-055224

SUMMARY OF THE INVENTION

Problems to be Solved by the Invention

However, the technologies proposed in Patent Documents 1 to 3 might not be able to further improve the technology of making the circuit substrate small and reducing the cost.

Therefore, the present technology is achieved in view of such a situation, and a main object thereof is to provide a high-frequency amplifier capable of making the circuit substrate small and reducing the cost.

Solutions to Problems

In order to solve the above-described object, a high-frequency amplifier as an example of the present technology is provided with a first substrate including a matching unit, and a second substrate including a transistor and a first impedance converter connected to each other, in which the matching unit of the first substrate and the first impedance converter are connected to each other via a first connection. Furthermore, the high-frequency amplifier as an example of the present technology is further provided with a third substrate including a matching unit, in which the second substrate may further include a second impedance converter connected to the transistor, and the second impedance converter and the matching unit of the third substrate may be connected to each other via a second connection.

Furthermore, an electronic device as an example of the present technology is provided with a high-frequency amplifier provided with a first substrate that amplifies an input signal or an output signal including a matching unit, and a second substrate including a transistor and a first impedance converter connected to each other, in which the matching unit of the first substrate and the first impedance converter are connected to each other via a first connection.

Furthermore, a communication device as an example of the present technology is provided with a high-frequency amplifier provided with a first substrate that amplifies a transmission signal or a reception signal including a matching unit, and a second substrate including a transistor and a first impedance converter connected to each other, in which the matching unit of the first substrate and the first impedance converter are connected to each other via a first connection.

Effects of the Invention

According to the present technology, it is possible to provide a high-frequency amplifier capable of making a circuit substrate small and reducing a cost. Note that, the effects of the present technology are not necessarily limited to the above-described effects and may be any of the effects described in the present disclosure.

BRIEF DESCRIPTION OF DRAWINGS

FIG. 8A illustrates the Smith chart, and FIG. 8B illustrates the admittance chart.

MODE FOR CARRYING OUT THE INVENTION

Hereinafter, a preferred mode for carrying out the present technology is described with reference to the drawings. Note that, embodiments hereinafter described illustrate an example of a representative embodiment of the present technology, and the scope of the present technology is not narrowed by them. Furthermore, in the present technology, any one of the following embodiments and variations thereof may be combined with one another.

Note that, the description is given in the following order.
1. High-frequency amplifier of first embodiment
  (1-1) Circuit Configuration Example of High-Frequency Amplifier
  (1-2) Operation example of high-frequency amplifier
  (1-3) Configuration example of impedance converter
  (1-4) Impedance movement
2. High-frequency amplifier of second embodiment
  (2-1) Circuit configuration example of high-frequency amplifier
  (2-2) Configuration example of impedance converter
  (2-3) Impedance movement
  (2-4) Relationship between impedance and admittance
3. Example of high-frequency amplifier to which the present technology is applied
4. Electronic device of third embodiment
5. Communication device of fourth embodiment
6. Usage example of high-frequency amplifier to which the present technology is applied 1. High-Frequency Amplifier of First Embodiment A high-frequency amplifier of a first embodiment according to the present technology is described with reference to FIGS. 1 to 4. The high-frequency amplifier of this embodiment is, for example, a high-frequency amplifier that may be used for a front-end circuit that is a transmission/reception end circuit on an antenna side for a fifth-generation mobile communication system (5G).

(1-1) Circuit Configuration Example of High-Frequency Amplifier

Figure 1:
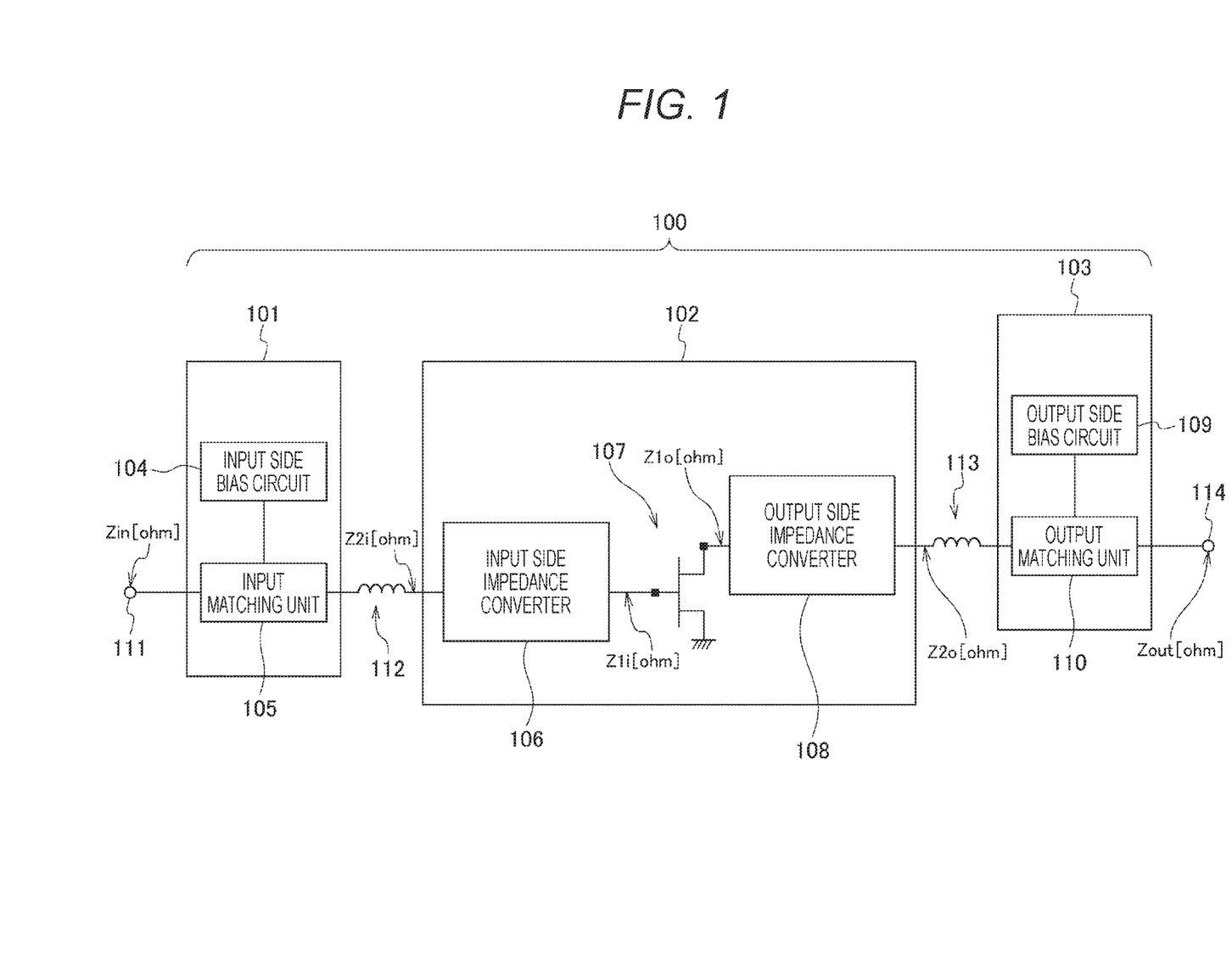
FIG. 1 is a circuit configuration diagram illustrating a high-frequency amplifier of a first embodiment according to the present technology.

First, an example of a circuit configuration of the high-frequency amplifier according to this embodiment is described with reference to FIG. 1. FIG. 1 is a circuit configuration diagram illustrating the high-frequency amplifier of this embodiment. As illustrated in FIG. 1, a high-frequency amplifier 100 of this embodiment is provided with a first substrate 101 that is an input-side external substrate, a second substrate 102 that is a circuit substrate formed by using a semiconductor chip, and a third substrate 103 that is an output-side external substrate.

The first substrate 101 includes an input-side bias circuit 104 and an input matching unit 105 electrically connected to the input-side bias circuit 104. The input-side bias circuit 104 is an electronic circuit for applying a bias voltage or a bias current on the input side. The input matching unit 105 is configured to match input-side impedance and impedance in the circuit to, for example, 50Ω.

The second substrate 102 includes an input-side impedance converter 106 that is a first impedance converter, a transistor 107, and an output-side impedance converter 108 that is a second impedance converter. The input-side impedance converter 106 is electrically connected to a gate terminal of the transistor 107. A drain terminal of the transistor 107 is electrically connected to the output-side impedance converter 108, and a source terminal of the transistor 107 is connected to a ground. The input-side impedance converter 106 and the output-side impedance converter 108 are configured to match input impedance Zin of the high-frequency amplifier 100, output impedance Zout of the high-frequency amplifier 100, and impedance of the transistor 107.

The third substrate 103 includes an output-side bias circuit 109 and an output matching unit 110 electrically connected to the output-side bias circuit 109. The output-side bias circuit 109 is an electronic circuit for applying a bias voltage or a bias current on the output side. The output matching unit 110 is configured to match impedance in the circuit and output-side impedance to, for example, 50Ω.

An input terminal 111 of the high-frequency amplifier 100 is connected to one end of the input matching unit 105. The other end of the input matching unit 105 is connected to the input-side impedance converter 106 via an input-side connection 112 that is a first connection. Furthermore, the output-side impedance converter 108 is connected to one end of the output matching unit 110 via an output-side connection 113 that is a second connection. The other end of output matching unit 110 is connected to an output terminal 114 of the high-frequency amplifier 100. For the input-side connection 112 and the output-side connection 113, for example, a wire, a bump and the like is used. In this manner, the high-frequency amplifier 100 connects the input-side connection 112 or the output-side connection 113 after increasing a real part of output impedance of the transistor by the input-side impedance converter 106 and/or the output-side impedance converter 108 to reduce an effect of the connection.

(1-2) Operation Example of High-Frequency Amplifier

Figure 2:
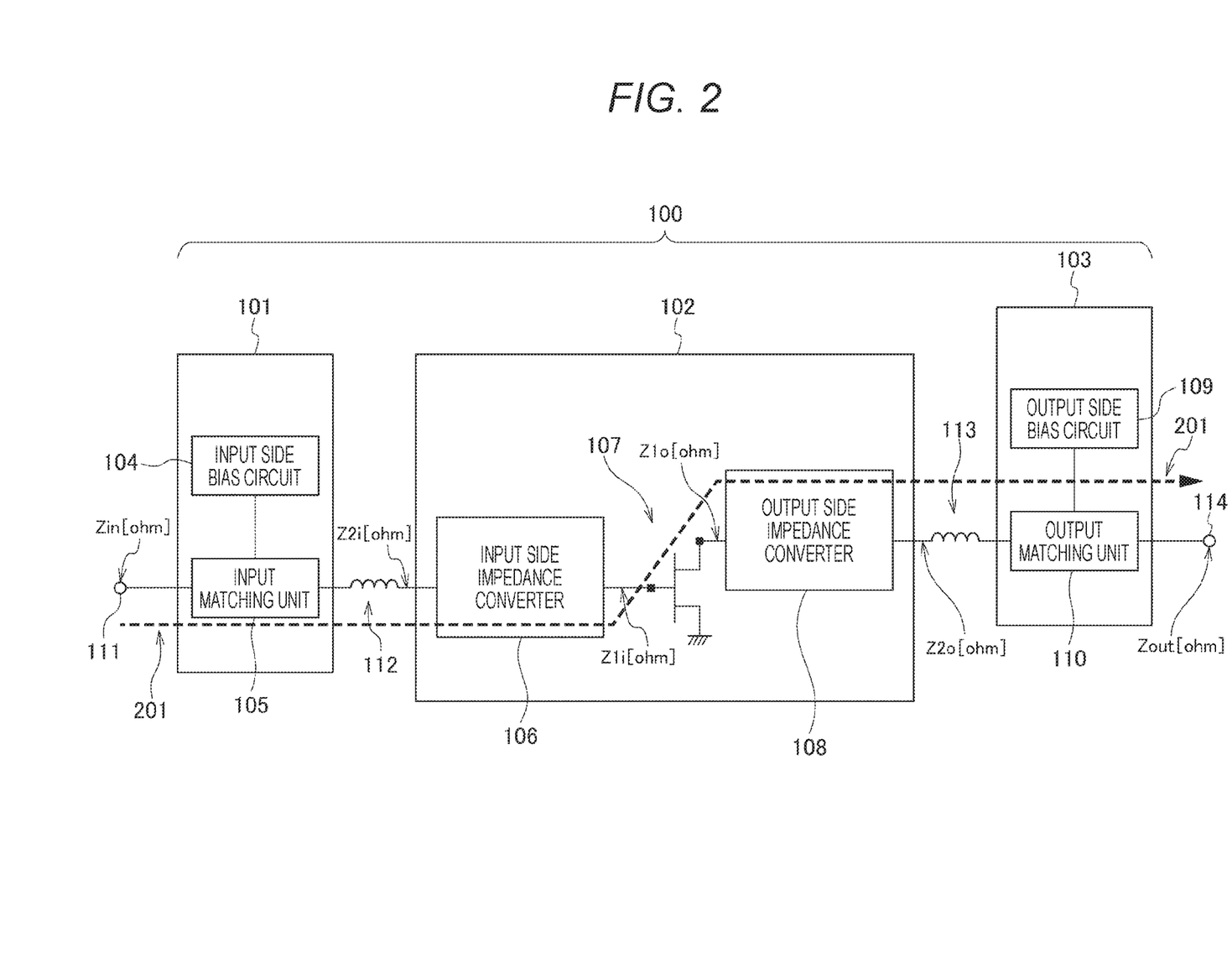
FIG. 2 is a circuit configuration diagram illustrating a signal flowing through the high-frequency amplifier in FIG. 1.

Next, an example of operation of the high-frequency amplifier according to this embodiment is described with reference to FIGS. 1 and 2. FIG. 2 is a circuit configuration diagram illustrating a signal flowing through the high-frequency amplifier of this embodiment.

As illustrated in FIG. 2, in the high-frequency amplifier 100 of this embodiment, for example, an RF signal 201 is input from a mixer, a quadrature modulator and the like to the input matching unit 105 via the input terminal 111. The RF signal 201 input to the input matching unit 105 is input to the input-side impedance converter 106 via the input-side connection 112, and input from the input-side impedance converter 106 to the output-side impedance converter 108 after being amplified via the transistor 107. The RF signal 201 amplified to be input to the output-side impedance converter 108 is input to the output matching unit 110 via the output-side connection 113. Then, the RF signal 201 input to the output matching unit 110 is output to, for example, an antenna via the output terminal 114.

As illustrated in FIGS. 1 and 2, in this embodiment, input impedance of the transistor 107 is set to Z1i [ohm], impedance at an end point on a second substrate 102 side of the input-side connection 112 is set to Z2i [ohm], and the input impedance of the high-frequency amplifier 100 is set to Zin [ohm]. Furthermore, in this embodiment, output impedance of the transistor 107 is set to Z1o [ohm], impedance at an end point on a second substrate 102 side of the output-side connection 113 is set to Z2o [ohm], and the output impedance of the high-frequency amplifier 100 is set to Zout [ohm].

Here, assuming that a real part of the impedance Z is set to Re(Z), the high-frequency amplifier 100 satisfies at least one of $$Re(Z1i)<Re(Z2i)<Re(Zin) \quad \text{(Equation 1)}$$

or $$Re(Z1o)<Re(Z2o)<Re(Zout) \quad \text{(Equation 2).}$$

For example, when Z1i=5−5j [Ω] and Zin=50 [Ω], from (Equation 1), it is sufficient when 5<Re(Z2i)<50.

Moreover, the high-frequency amplifier 100 satisfies at least one of $$0.1*Re(Zin)<Re(Z2i)<0.9*Re(Zin) \quad \text{(Equation 3)}$$

or $$0.1*Re(Zout)<Re(Z2o)<0.9*Re(Zout) \quad \text{(Equation 4).}$$

For example, when Zin=50 [Ω], from (Equation 3), it is sufficient when 5<Re(Z2i)<45.

(1-3) Configuration Example of Impedance Converter

Figure 3:
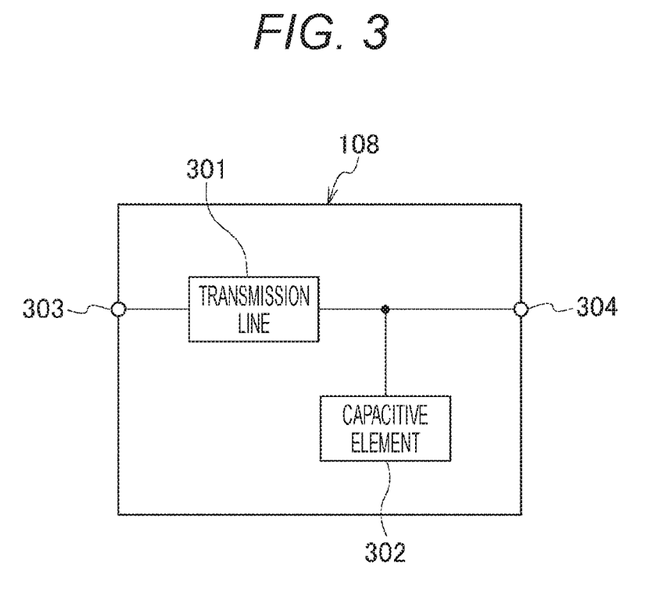
FIG. 3 is a schematic diagram illustrating an output-side impedance converter of the high-frequency amplifier in FIG. 1.

Next, an example of a configuration of the output-side impedance converter 108 of the second substrate 102 according to this embodiment is described with reference to FIG. 3. FIG. 3 is a schematic diagram illustrating the output-side impedance converter of the high-frequency amplifier according to this embodiment.

The output-side impedance converter 108 is provided with a transmission line 301 and a capacitive element 302 electrically connected to the transmission line 301. The transmission line 301 is connected in series between a transistor-side input terminal 303 and a connection-side output terminal 304 of the output-side impedance converter 108. The capacitive element 302 is connected between the transmission line 301 and the connection-side output terminal 304 to be branched. Configuration examples of the capacitive element 302 include a MIM capacitor+Backside VIA, a capacitive open stub and the like.

Here, as an example, assuming that the impedance of the high-frequency amplifier 100 is set to Re(Z1o)=10Ω, Re(Z2o)=30Ω, and Re(Zout)=50Ω, impedance of the transistor-side input terminal 303 is 10−j*10 [ohm], and impedance of the connection-side output terminal 304 is 30−j*10 [ohm].

(1-4) Impedance Movement

Figure 4:
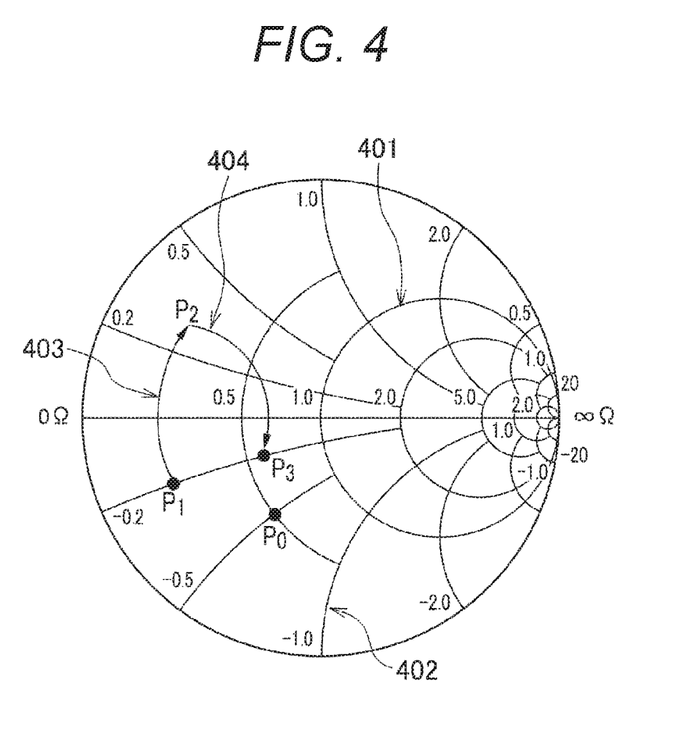
FIG. 4 is a Smith chart illustrating impedance movement in the high-frequency amplifier in FIG. 1.

Next, an example of impedance movement in the high-frequency amplifier 100 according to this embodiment is described with reference to FIG. 4. FIG. 4 is a Smith chart illustrating the impedance movement of the output-side impedance converter 108 of this embodiment.

As illustrated in the Smith chart in FIG. 4, a concentric circumferential curved line group 401 represents contour lines of the real part of impedance, and a curved line group 402 intersecting with the curved line group 401 represents contour lines of an imaginary part of impedance. On a line segment in a left to right direction representing a diameter of a circle of the Smith chart, a left end and a right end in FIG. 4 indicates 0Ω and ∞ Ω, respectively, and the real part of impedance increases from the left end toward the right end. As an example, assuming that reference impedance is 50Ω, a point $P_0$ in FIG. 4 indicates 25−j*25Ω.

A curved line 403 from a point P1 to a point P2 in FIG. 4 indicates a change in impedance due to the transmission line 301, and a curved line 404 from the point P2 to a point P3 in FIG. 4 indicates a change in impedance due to the capacitive element 302. As illustrated in FIG. 4, the output-side impedance converter 108 converts the real part of impedance higher from the point P1 toward the point P3 without changing the imaginary part of impedance. However, the imaginary part of impedance may change before and after the conversion.

As described above, in the high-frequency amplifier 100 according to this embodiment, the input matching unit 105 and the output matching unit 110 conventionally arranged in the second substrate 102 of the semiconductor chip are installed on the first substrate 101 and the third substrate 103 that are the external substrates thereof. Therefore, it is possible to reduce a size of the semiconductor chip a material of which is expensive such as a GaN substrate considered to have higher performance of the high-frequency amplifier 100. Furthermore, since the output-side impedance converter 108 may reduce an impedance conversion ratio, it is not necessary to convert the impedance of the transistor 107 to the input/output impedance of the high-frequency amplifier 100, so that the semiconductor chip may be made small. Therefore, it is possible to make the second substrate 102 of the high-frequency amplifier 100 small to reduce a cost without adjusting a wire length and the like of the output-side connection 113.

Moreover, the high-frequency amplifier 100 according to this embodiment increases the real part of impedance by the output-side impedance converter 108, so that it is possible to reduce an effect of manufacturing variation of the output-side connection 113 on a characteristic of the high-frequency amplifier 100. In this manner, the high-frequency amplifier 100 may be designed to be robust against the manufacturing variation (resistant to an error factor) because it is possible to sufficiently reduce the effect of the manufacturing variation even if a wire and the like is used between the semiconductor chip and the external substrate. Furthermore, in the high-frequency amplifier 100, the real part of impedance of the output-side connection 113 may be made higher than that in a terminal portion of the transistor 107. This also allows the high-frequency amplifier 100 to realize the design robust against the manufacturing variation of the output-side connection 113. Note that, the manufacturing variation is intended to mean inductance shift due to, for example, a difference in wire length.

2. High-Frequency Amplifier of Second Embodiment

A high-frequency amplifier of a second embodiment according to the present technology is described with reference to FIGS. 5, 6, 7, 8A, and 8B. The high-frequency amplifier of this embodiment differs from the high-frequency amplifier 100 of the first embodiment in that a bias connection is connected in the middle of an impedance converter in a second substrate. Note that, a configuration similar to that of the first embodiment is assigned with the same reference numeral, and description thereof is omitted.

(2-1) Circuit Configuration Example of High-Frequency Amplifier

Figure 5:
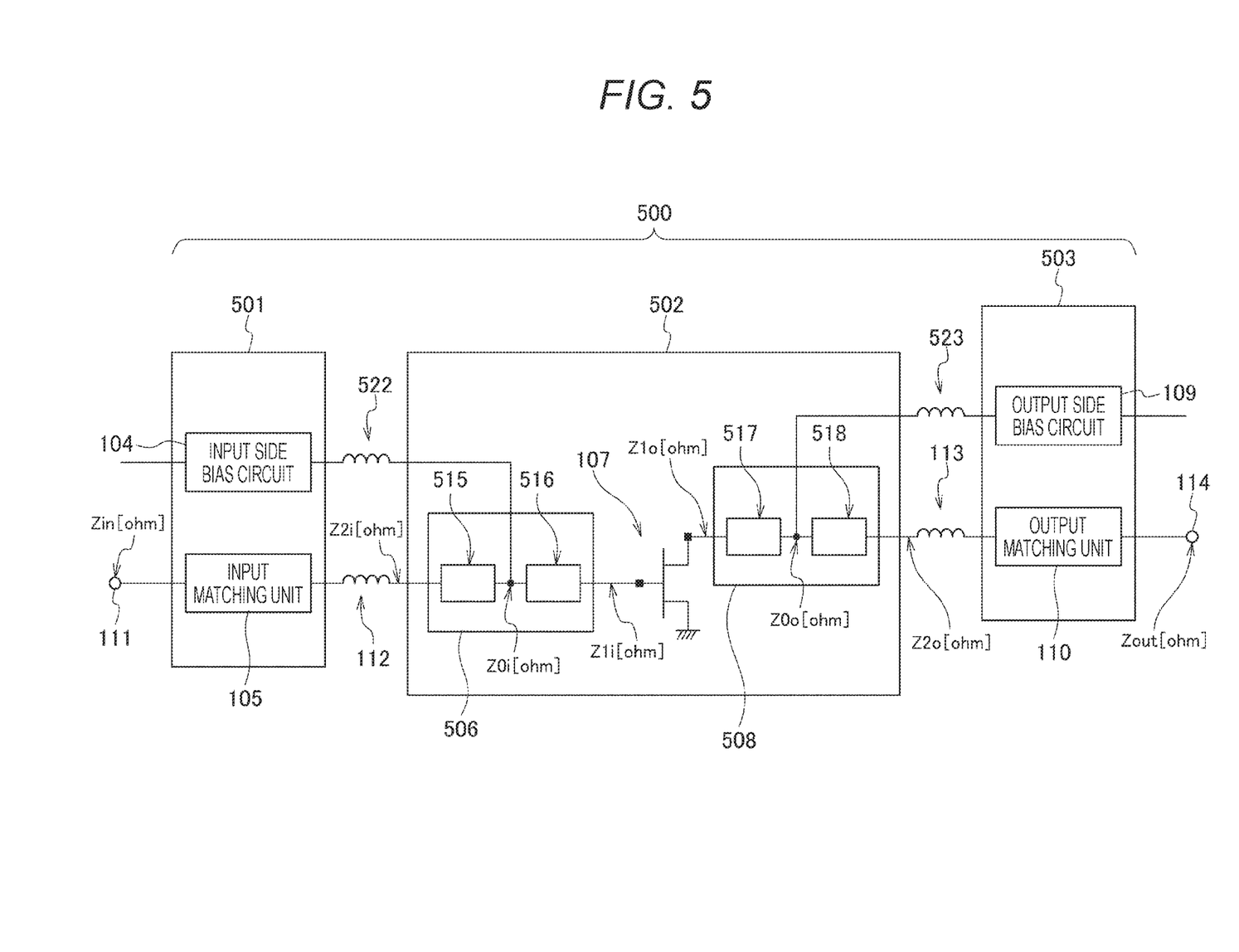
FIG. 5 is a circuit configuration diagram illustrating a high-frequency amplifier of a second embodiment according to the present technology.

First, an example of a circuit configuration of the high-frequency amplifier according to this embodiment is described with reference to FIG. 5. FIG. 5 is a circuit configuration diagram illustrating the high-frequency amplifier of this embodiment. As illustrated in FIG. 5, a high-frequency amplifier 500 of this embodiment is provided with a first substrate 501 that is an input-side external substrate, a second substrate 502 formed by using a semiconductor chip, and a third substrate 503 that is an output-side external substrate.

The first substrate 501 includes an input-side bias circuit 104 and an input matching unit 105. However, on the first substrate 501, the input-side bias circuit 104 and the input matching unit 105 are not electrically connected to each other.

The second substrate 502 includes an input-side impedance converter 506 that is a first impedance converter, a transistor 107, and an output-side impedance converter 508 that is a second impedance converter. The input-side impedance converter 506 is electrically connected to a gate terminal of the transistor 107. A drain terminal of the transistor 107 is electrically connected to the output-side impedance converter 508, and a source terminal of the transistor 107 is connected to a ground.

The input-side impedance converter 506 includes two transmission lines 515 and 516 connected in series. The output-side impedance converter 508 includes two transmission lines 517 and 518 connected in series. Note that, the number of transmission lines included in the input-side impedance converter 506 and the output-side impedance converter 508 is not limited to two, and may be three or more.

The third substrate 503 includes an output-side bias circuit 109 and an output matching unit 110. However, on the third substrate 503, the output-side bias circuit 109 and the output matching unit 110 are not electrically connected to each other.

An input terminal 111 of the high-frequency amplifier 500 is connected to one end of the input matching unit 105. The other end of the input matching unit 105 is connected to the input-side impedance converter 506 via an input-side connection 112. Furthermore, the output-side impedance converter 508 is connected to one end of the output matching unit 110 via an output-side connection 113. The other end of output matching unit 110 is connected to an output terminal 114 of the high-frequency amplifier 500.

In contrast, the input-side bias circuit 104 is connected between the transmission lines 515 and 516 in the input-side impedance converter 506 via an input-side bias connection 522. Furthermore, the output-side bias circuit 109 is connected between the transmission lines 517 and 518 in the output-side impedance converter 508 via an output-side bias connection 523. For the input-side bias connection 522 and the output-side bias connection 523, for example, a wire, a bump and the like is used.

Furthermore, as in the first embodiment, input impedance of the transistor 107 is set to $Z1i$ [ohm], impedance at an end point on a second substrate 502 side of the input-side connection 112 is set to $Z2i$ [ohm], and input impedance of the high-frequency amplifier 500 is set to $Zin$ [ohm]. Furthermore, output impedance of the transistor 107 is set to $Z1o$ [ohm], impedance at an end point on a second substrate 502 side of the output-side connection 113 is set to $Z2o$ [ohm], and output impedance of the high-frequency amplifier 500 is set to $Zout$ [ohm]. Moreover, input impedance at a branch point to the input-side bias connection 522 between the transmission lines 515 and 516 is set to $Z0i$ [ohm], and output impedance at a branch point to the output-side bias circuit 109 between the transmission lines 517 and 518 is set to $Z0o$ [ohm].

Here, the high-frequency amplifier 500 satisfies at least one of (Equation 1) or (Equation 2) described above as in the first embodiment. Moreover, the high-frequency amplifier 500 satisfies at least one of (Equation 3) or (Equation 4) described above.

(2-2) Configuration Example of Impedance Converter

Figure 6:
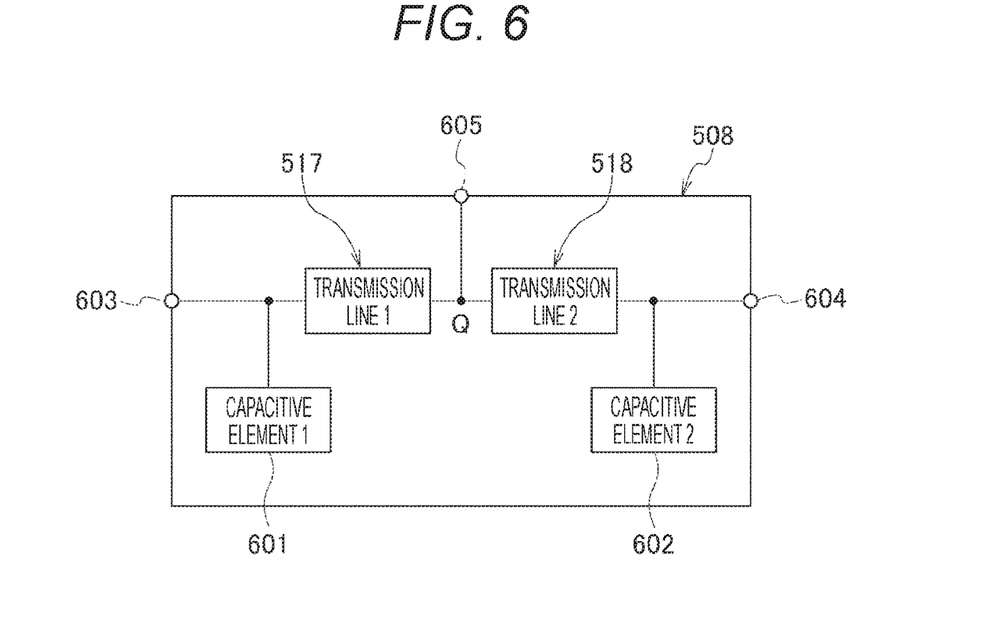
FIG. 6 is a schematic diagram illustrating an output-side impedance converter of the high-frequency amplifier in FIG. 5.

Next, an example of a configuration of the output-side impedance converter 508 of the second substrate 502 according to this embodiment is described with reference to FIG. 6. FIG. 6 is a schematic diagram illustrating the output-side impedance converter of the high-frequency amplifier of this embodiment.

The output-side impedance converter 508 is provided with the two transmission lines 517 and 518 connected in series and two capacitive elements 601 and 602. The transmission lines 517 and 518 are connected in series between a transistor-side input terminal 603 and a connection-side output terminal 604 of the output-side impedance converter 508. The capacitive element 601 is connected between the transistor-side input terminal 603 and the transmission line 517 to be branched. The capacitive element 602 is connected between the transmission line 518 and the connection-side output terminal 604 to be branched.

In the output-side impedance converter 508, a branch point Q between the transmission lines 517 and 518 and a bias connection-side output terminal 605 are connected to each other. In this embodiment, the branch point Q represents a feeding point.

Here, as an example, impedance of the high-frequency amplifier 500 is set to Re(Z1o)=10Ω, Re(Z2o)=30Ω, Re(Zout)=50Ω, Re(1/Z1o)=0.05 S, Re(1/Z0o)=0.25 S, and Re(1/Zout)=0.02 S. At that time, impedance of the transistor-side input terminal 603 is 10−j*10 [ohm], impedance of the branch point Q that is the feeding point is 4 [ohm], and impedance of the connection-side output terminal 604 is 30−j*10 [ohm].

(2-3) Impedance Movement

Figure 7:
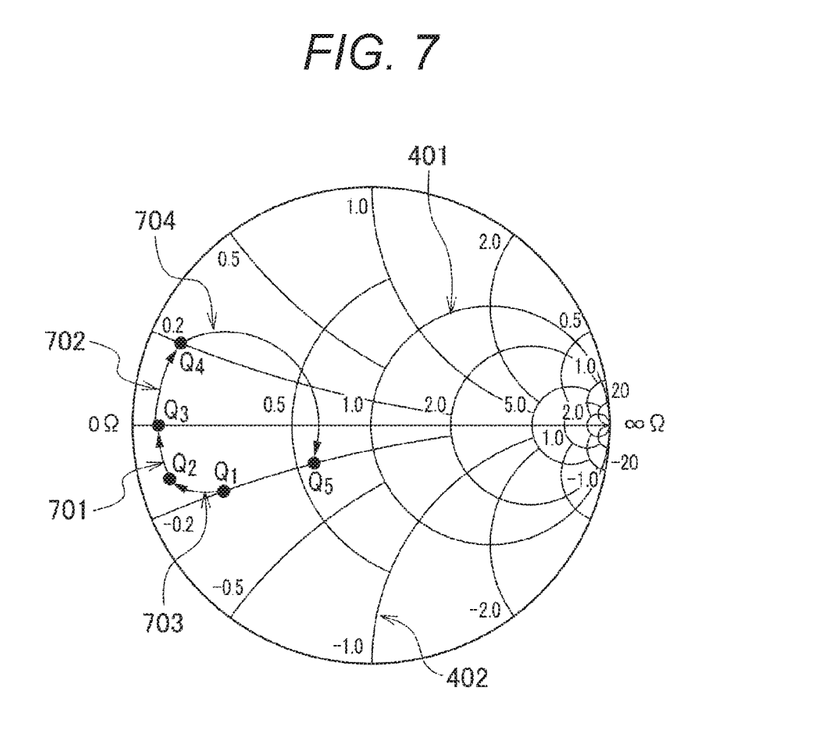
FIG. 7 is a Smith chart illustrating impedance movement in the high-frequency amplifier in FIG. 5.

Next, an example of impedance movement in the high-frequency amplifier 500 according to this embodiment is described with reference to FIG. 7. FIG. 7 is a Smith chart illustrating the impedance movement of the output-side impedance converter 508 of this embodiment. As in FIG. 4, a concentric circumferential curved line group 401 in the Smith chart in FIG. 7 represents contour lines of a real part of impedance, and a curved line group 402 intersecting with the curved line group 401 represents contour lines of an imaginary part of impedance.

A curved line 701 from a point Q2 to a point Q3 in FIG. 7 represents a change in impedance due to the transmission line 517, and a curved line 702 from the point Q3 to a point Q4 in FIG. 7 represents a change in impedance due to the transmission line 518. A curved line 703 from a point Q1 to the point Q2 in FIG. 7 represents a change in impedance due to the capacitive element 601, and a curved line 704 from the point Q4 to a point Q5 in FIG. 7 represents a change in impedance due to the capacitive element 602. As illustrated in FIG. 7, the output-side impedance converter 508 converts the real part of impedance higher from the point Q1 toward the point Q5 without changing the imaginary part of impedance. However, the imaginary part of impedance may change before and after the conversion.

(2-4) Relationship Between Impedance and Admittance

Figure 8A:
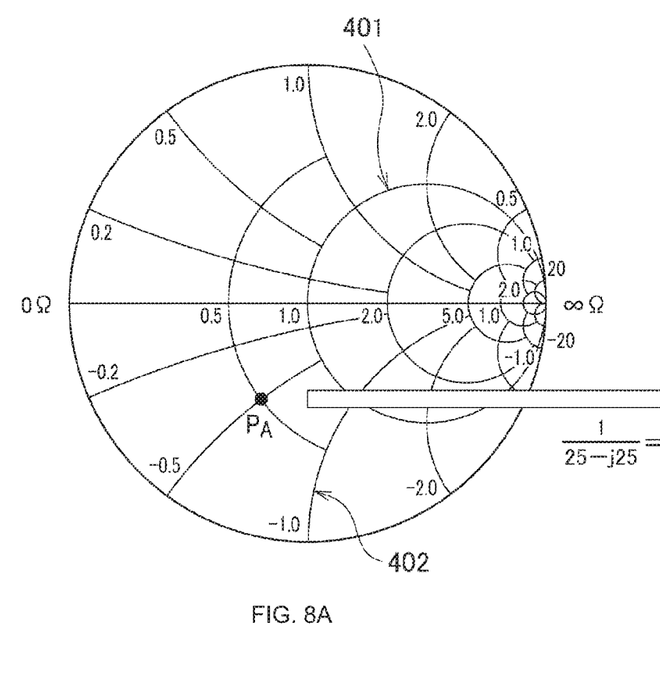
FIGS. 8A and 8B are views illustrating a relationship between the Smith chart and an admittance chart.
Figure 8B:
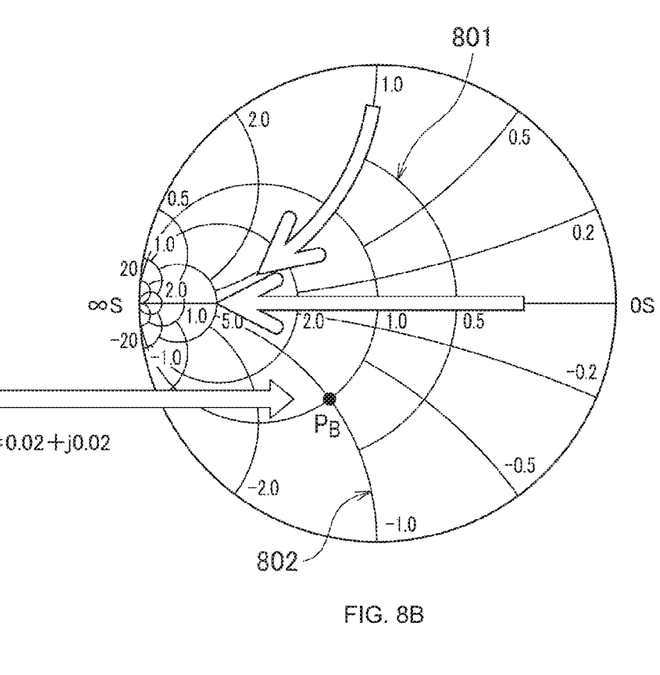

Next, an example of a relationship between the impedance and admittance of the high-frequency amplifier 500 according to this embodiment is described with reference to FIGS. 8A and 8B. FIGS. 8A and 8B are views illustrating a relationship between the Smith chart and an admittance chart. FIG. 8A is a Smith chart similar to that in FIG. 7, and FIG. 8B is an admittance chart corresponding to FIG. 8A.

As in FIG. 7, a concentric circumferential curved line group 401 in the Smith chart in FIG. 8A represents contour lines of the real part of impedance, and a curved line group 402 intersecting with the curved line group 401 represents contour lines of the imaginary part of impedance. As an example, assuming that reference impedance is 50Ω, a point $P_A$ in FIG. 8A indicates 25−j*25Ω.

As illustrated in the admittance chart in FIG. 8B, a concentric circumferential curved line group 801 represents contour lines of a real part of admittance, and a curved line group 802 intersecting with the curved line group 801 represents contour lines of an imaginary part of admittance. On a line segment in a left to right direction representing a diameter of a circle of the admittance chart, a right end and a left end in FIG. 8B indicate 0S and ∞ S, respectively, and the real part of admittance increases from the right end toward the left end. As an example, assuming that the reference impedance is 50 [Ω]=0.02 [S], a point $P_B$ in FIG. 8B indicates 1/(25−j*25) [Q]=0.02+j0.02 [S].

From above, input admittance of the transistor 107 is 1/Z1i [S], and admittance at an end point (branch point) on a second substrate 502 side of the input-side bias connection 522 is 1/Z0i [S]. Furthermore, output admittance of the transistor 107 is 1/Z1o [S], and admittance at an end point (branch point) on the second substrate 502 side of the output-side bias connection 523 is 1/Z0o [S].

Here, assuming that a real part of the admittance 1/Z is set to Re(1/Z), the high-frequency amplifier 500 satisfies at least one of $$Re(1/Z1i) \leq Re(1/Z0i) \qquad \text{(Equation 5)}$$

or $$Re(1/Z1o) \leq Re(1/Z0o) \qquad \text{(Equation 6).}$$

For example, when Z1i=5−5j [Ω], 1/(Z1i)=0.1+0.1j [S] is satisfied, so that it is only required that 0.1 Re(1/Z0i) from (Equation 5).

Moreover, the high-frequency amplifier 500 satisfies at least one of $$Re(1/Z0i) > 2*Re(1/Zin) \qquad \text{(Equation 7)}$$

or $$Re(1/Z0o) > 2*Re(1/Zout) \qquad \text{(Equation 8).}$$

For example, when Zin=50 [Ω], 1/Zin=0.02 [S] is satisfied, so that it is only required that 0.04<Re(1/Z0i) from (Equation 7).

As described above, the high-frequency amplifier 500 according to this embodiment may make the second substrate 502 of the high-frequency amplifier 500 small to reduce a cost as is the case with the high-frequency amplifier 100 according to the first embodiment. Furthermore, in the high-frequency amplifier 500, as is the case with the high-frequency amplifier 100 according to the first embodiment, it is possible to increase the real part of impedance by the input-side impedance converter 506 and/or the output-side impedance converter 508 to sufficiently reduce an effect of manufacturing variation, so that a design robust against the manufacturing variation may be realized. Furthermore, in the high-frequency amplifier 500, the real part of impedance of the output-side connection 113 may be made higher than that in a terminal portion of the transistor 107 as is the case with the high-frequency amplifier 100 according to the first embodiment. This also allows the high-frequency amplifier 500 to realize the design robust against the manufacturing variation of the output-side connection 113.

Moreover, in the high-frequency amplifier 500 according to this embodiment, the input-side impedance converter 506 and/or the output-side impedance converter 508 are formed such that the real part of admittance of the input-side bias connection 522 and/or the output-side bias connection 523 is equal to or larger than the input/output admittance of the transistor 107. Therefore, circuits in the input-side bias circuit 104 and/or the output-side bias circuit 109 change little from the input/output unit of the high-frequency amplifier 500 and the transistor 107, and an effect on a characteristic becomes small, so that the above-described bias circuits may be easily adjusted.

3. Example of High-Frequency Amplifier to which the Present Technology is Applied An example of a high-frequency amplifier to which the present technology is applied is described with reference to FIGS. 9 to 11.

Figure 9:
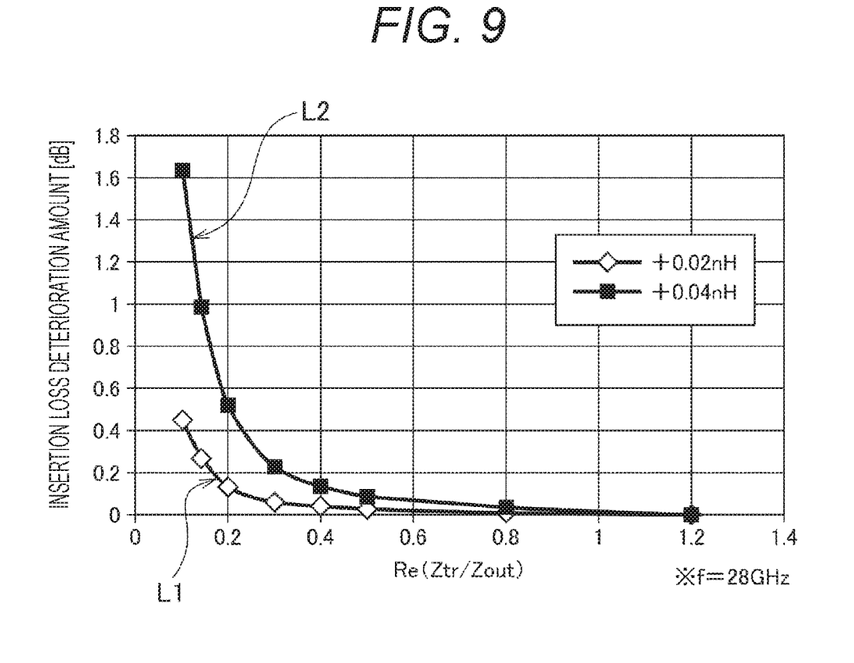
FIG. 9 is a graph illustrating a relationship between an insertion loss deterioration amount of a connection and a real part of impedance.

First, a relationship between an insertion loss deterioration amount of a connection and a real part of impedance is described with reference to FIG. 9. FIG. 9 is a graph illustrating the relationship between the insertion loss deterioration amount of the connection and the real part of impedance. A real part Re(Ztr/Zout) of a ratio of output impedance (Ztr) of the transistor to output impedance (Zout) of the high-frequency amplifier is plotted along the abscissa in FIG. 9, and the insertion loss deterioration amount [dB] of the connection of the high-frequency amplifier is plotted along the ordinate in FIG. 9. In this example, Zout=50Ω is used as an example.

A curved line L1 in FIG. 9 indicates a case where a shift from about 0.1 nH is +0.02 nH at a frequency f=28 GHz. A curved line L2 in FIG. 9 indicates a case where the shift from 0.1 nH is +0.04 nH at a frequency f=28 GHz.

As illustrated in FIG. 9, it is understood that a passing characteristic of the connection is significantly deteriorated in a case where the real part of output impedance Re(Ztr) of the transistor is equal to or smaller than 10Ω, for example. Especially, in the curved line L2 with a larger shift from about 0.1 nH of the real part of impedance Re(Ztr/Zout) described above, the passing characteristic of the connection is significantly deteriorated than in the curved line L1 with a smaller shift. Therefore, it becomes necessary to increase the real part of impedance immediately before the connection and reduce the effect of the connection (wire).

Figure 10:
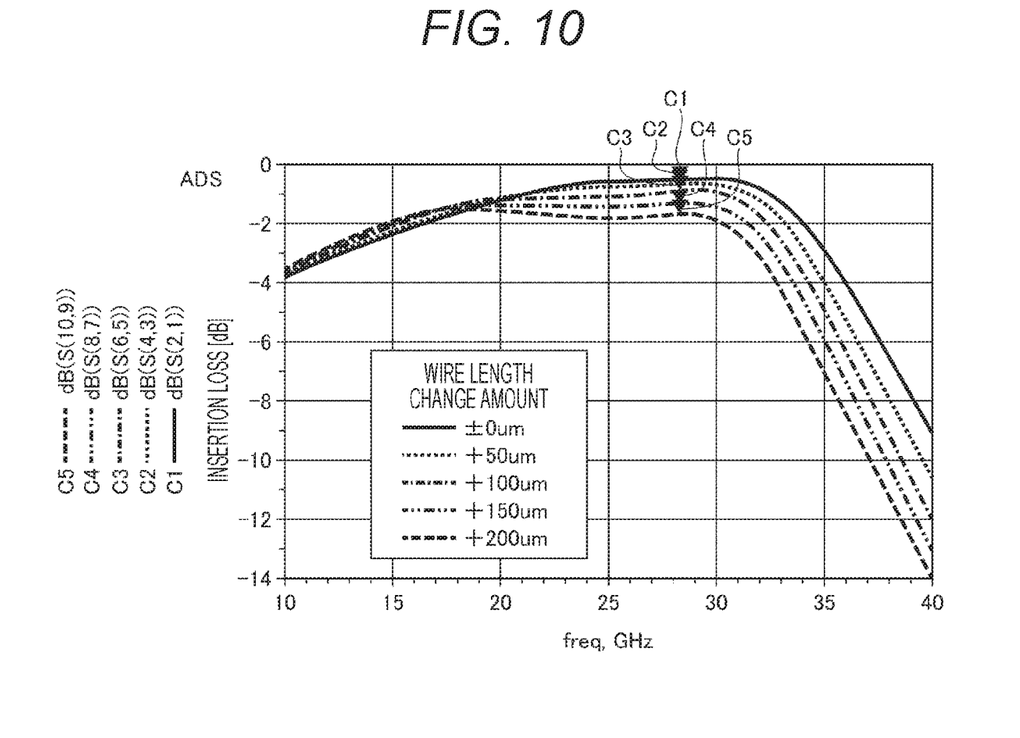
FIG. 10 is a graph illustrating a relationship between a change amount of a wire length of the connection and a passing characteristic of the high-frequency amplifier to which the conventional technology is applied.
Figure 11:
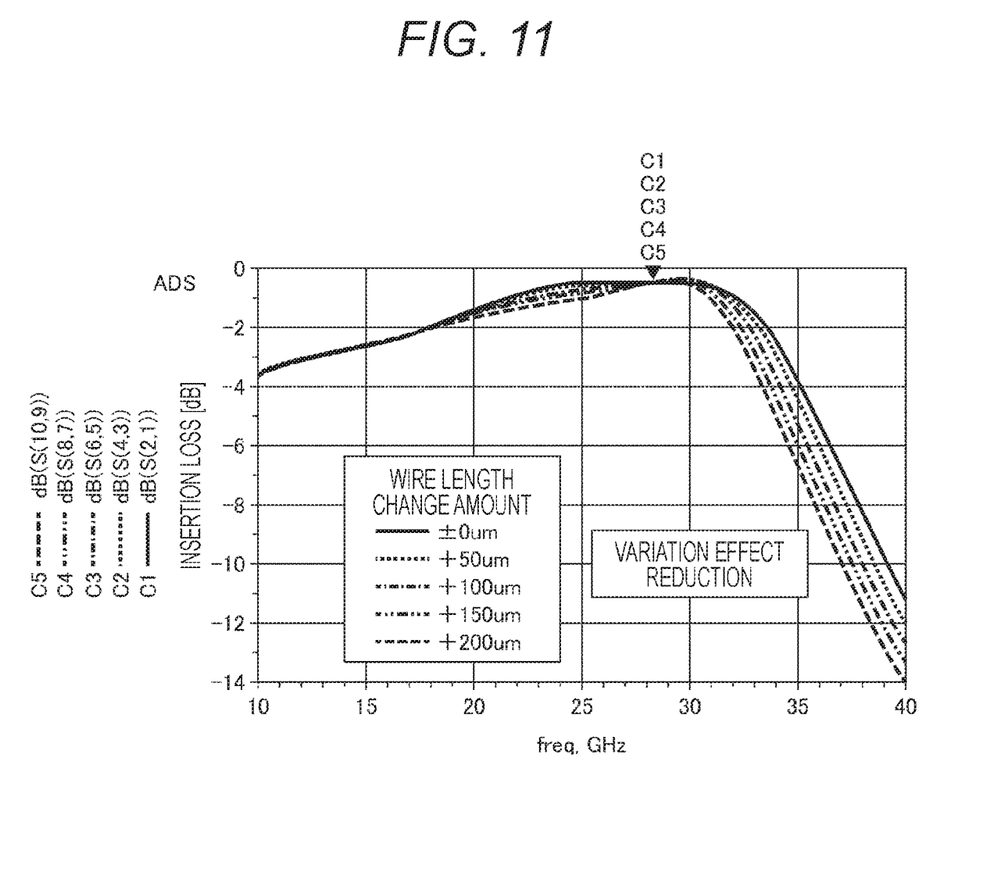
FIG. 11 is a graph illustrating the relationship between the change amount of the wire length of the connection and the passing characteristic of the high-frequency amplifier to which the present technology is applied.

Next, a relationship between a change amount of the wire length that is the connection and the passing characteristic is described. FIG. 10 is a graph illustrating a relationship between the change amount of the wire length of the connection and the passing characteristic of the high-frequency amplifier to which the conventional technology is applied. FIG. 11 is a graph illustrating the relationship between the change amount of the wire length of the connection and the passing characteristic of the high-frequency amplifier to which the present technology is applied. In FIGS. 10 and 11, a frequency [GHz] is plotted along the abscissa, and an insertion loss [dB] from an output of a drain terminal of the transistor to an output of the high-frequency amplifier (matching circuit) is plotted along the ordinate.

In FIG. 10 and FIG. 11, with respect to an original wire length of 300 um, a curved line C1 indicates a case where the change amount of the wire length is ±0 um, a curved line C2 indicates a case where the change amount of the wire length is ±50 um, a curved line C3 indicates a case where the change amount of the wire length is ±100 um, a curved line C4 indicates a case where the change amount of the wire length is ±150 um, and a curved line C5 indicates a case where the change amount of the wire length is ±200 um.

As illustrated in FIG. 10, for example, with the wire length +200 um, the insertion loss at 28 GHz is deteriorated by about 1 dB with respect to ±0 um. From this, as indicated by curved lines C1 to C5 in FIG. 10, it is understood that, in the high-frequency amplifier to which the conventional technology is applied, as the frequency increases, an effect of manufacturing variation on the wire length on the output side increases due to the change amount of the wire length.

In contrast, as illustrated in FIG. 11, for example, with the wire length +200 um, the insertion loss at 28 GHz is not deteriorated and improved. Therefore, as indicated by curved lines C1 to C5 in FIG. 11, it is understood that, in the high-frequency amplifier to which the present technology is applied, even when the frequency increases, the effect of the manufacturing variation on the wire length on the output side may be decreased by the change amount of the wire length.

4. Electronic Device of Third Embodiment

An electronic device of a third embodiment according to the present technology is an electronic device provided with the high-frequency amplifier of any one of the first and second embodiments according to the present technology. The high-frequency amplifiers of the first and second embodiments according to the present technology are as described above, so that descriptions thereof are herein omitted. The electronic device of the third embodiment according to the present technology is provided with the small-sized high-frequency amplifier with excellent reliability, so that it is possible to make the electronic device small and improve performance such as a characteristic.

5. Communication Device of Fourth Embodiment

A communication device of a fourth embodiment according to the present technology is a device provided with the high-frequency amplifier of any one of the first and second embodiments according to the present technology. The high-frequency amplifiers of the first and second embodiments according to the present technology are as described above, so that descriptions thereof are herein omitted. The communication device of the fourth embodiment according to the present technology is provided with a small-sized high-frequency amplifier with excellent reliability, so that it is possible to improve performance such as amplification of a transmission/reception signal. Examples of the communication device of this embodiment include, for example, a mobile communication terminal (mobile phone and smart phone), a mobile communication base station, other wireless stations, an IoT device, a radar and the like.

Figure 12:
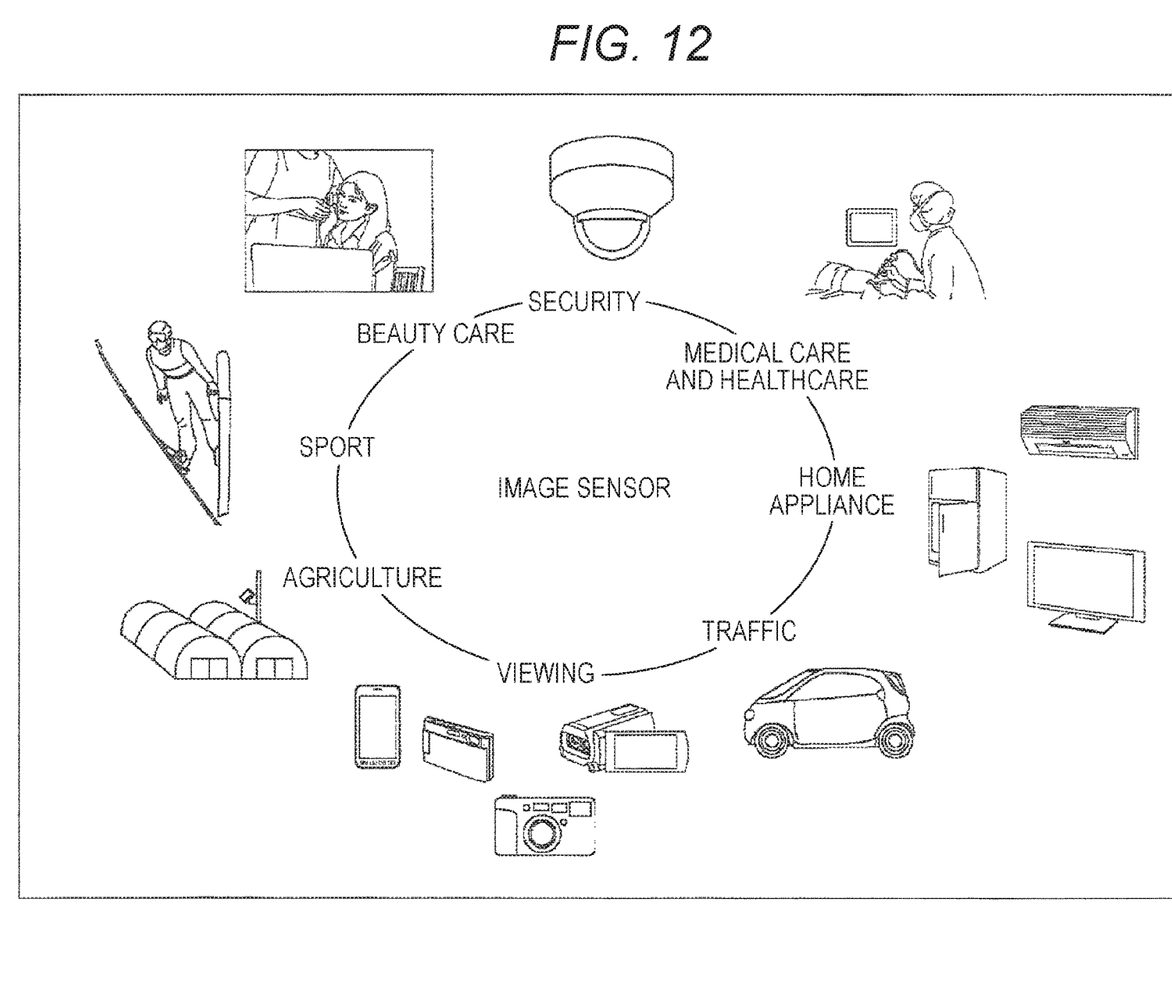
FIG. 12 is a view illustrating a usage example of the high-frequency amplifier to which the present technology is applied.

6. Usage Example of High-Frequency Amplifier to which the Present Technology is Applied FIG. 12 is a view illustrating a usage example of the high-frequency amplifier of the first and second embodiments according to the present technology.

The above-described high-frequency amplifiers of the first and second embodiments may be used in various cases in which light such as visible light, infrared light, ultraviolet light, and X-ray is sensed as described hereinafter, for example. That is, as illustrated in FIG. 12, for example, the high-frequency amplifiers of the first and second embodiments may be used in a device (for example, the electronic device of the third embodiment described above) provided with a solid-state imaging element (image sensor) used in a viewing field in which an image to be viewed is captured, a traffic field, a home appliance field, a medical care and health care field, a security field, a beauty care field, a sports field, an agricultural field and the like, for example.

Specifically, in the viewing field, for example, the high-frequency amplifiers of the first and second embodiments may be used in a device for capturing an image to be viewed such as a digital camera, a smartphone, and a mobile phone with a camera function, for example, in the viewing field.

In the traffic field, the high-frequency amplifiers of the first and second embodiments may be used in a device used for traffic such as an on-vehicle sensor that captures images of the front, back, surroundings, inside and the like of an automobile, a monitoring camera that monitors running vehicles and roads, and a ranging sensor that measures a distance between vehicles and the like for safe driving such as automatic stop, recognition of a driver's condition and the like, for example.

In the home appliance field, the high-frequency amplifiers of the first and second embodiments may be used in a device for home appliance such as a television receiver, a refrigerator, and an air conditioner for capturing an image of a user's gesture and operating the device according to the gesture, for example.

In the medical care and health care field, the high-frequency amplifiers of the first and second embodiments may be used in a device for medical care and health care such as an endoscope and a device performing angiography by receiving infrared light, for example.

In the security field, the high-frequency amplifiers of the first and second embodiments may be used in a device for security such as a security monitoring camera and a personal authentication camera, for example.

In the beauty care field, the high-frequency amplifiers of the first and second embodiments may be used in a device for beauty care such as a skin measuring device that captures an image of skin and a microscope that capture an image of head skin, for example.

In the sports field, the high-frequency amplifiers of the first and second embodiments may be used in a device for sports such as an action camera and a wearable camera for sports and the like, for example.

In the agricultural field, the high-frequency amplifiers of the first and second embodiments may be used in a device for agriculture such as a camera for monitoring a land and crop state, for example.

Note that, the embodiments of the present technology are not limited to the above-described embodiments and various modifications may be made without departing from the gist of the present technology. For example, it is possible to adopt a combination of all or a part of a plurality of embodiments described above. Furthermore, the effect described in this specification is illustrative only; the effect is not limited thereto and there may also be another effect.

Furthermore, the present technology may have the following configurations.

(1)
A high-frequency amplifier provided with:
a first substrate including a matching unit; and a second substrate including a transistor and a first impedance converter connected to each other,
in which the matching unit of the first substrate and the first impedance converter are connected to each other via a first connection.

(2)
The high-frequency amplifier according to (1), further provided with:
a third substrate including a matching unit,
in which the second substrate further includes a second impedance converter connected to the transistor, and
the second impedance converter and the matching unit of the third substrate are connected to each other via a second connection.

(3)
The high-frequency amplifier according to (2),
in which at least one of the first substrate or the third substrate includes a bias circuit, and
the bias circuit is connected to the matching unit in the substrate including the bias circuit.

(4)
The high-frequency amplifier according to (2) or (3),
in which at least one of $Re(Z1i)<Re(Z2i)<Re(Zin)$ or $Re(Z1o)<Re(Z2o)<Re(Zout)$ is satisfied,
when input (output) impedance of the transistor is set to $Z1i$ ($Z1o$), impedance at an end point on a second substrate side of an input (output) side connection is set to $Z2i$($Z2o$), and input (output) impedance of an amplifier is set to $Zin$($Zout$).

(5)
The high-frequency amplifier according to (4),
in which at least one of $0.1*Re(Zin)<Re(Z2i)<0.9*Re(Zin)$ or $0.1*Re(Zout)<Re(Z2o)<0.9*Re(Zout)$ is satisfied.

(6)
The high-frequency amplifier according to (3),
in which the bias circuit in at least one of the first substrate or the third substrate is connected to the first or second impedance converter via a bias connection.

(7)
The high-frequency amplifier according to (6) that satisfies at least one of $Re(1/Z1i) \leq Re(1/Z0i)$ or $Re(1/Z1o) \leq Re(1/Z0o)$,
when input (output) admittance of the transistor is set to $1/Z1i$ ($1/Z1o$) and admittance at an end point on a second substrate side of the bias connection is set to $1/Z0i$($1/Z0o$).

(8)
The high-frequency amplifier according to (7),
in which at least one of $Re(1/Z0i)>2*Re(1/Zin)$ or $Re(1/Z0o)>2*Re(1/Zout)$ is satisfied.

(9)
The high-frequency amplifier according to any one of (1) to (8),
in which the first impedance converter includes a transmission line connected in series to the first connection, and a capacitive element connected in parallel with the first connection.

(10)
An electronic device provided with:
the high-frequency amplifier according to any one of (1) to (9) that amplifies an input signal or an output signal.

(11)
A communication device provided with:
the high-frequency amplifier according to any one of (1) to (9) that amplifies a transmission signal or a reception signal.

REFERENCE SIGNS LIST 100, 500 High-frequency amplifier
101, 501 First substrate
102, 502 Second substrate
103, 503 Third substrate
104 Input-side bias circuit
105 Input matching unit
106, 506 Input-side impedance converter
107 Transistor
108, 508 Output-side impedance converter
109 Output-side bias circuit
110 Output matching unit
111, 303, 603 Input terminal
112, 113, 522, 523 Connection
114, 304, 604, 605 Output terminal
201 RF signal
301, 515 to 518 Transmission line
302, 601, 602 Capacitive element
401, 402, 801, 802 Curved line group (contour line)

The invention claimed is:
1. A high-frequency amplifier, comprising:
a first substrate that includes a first matching unit;
a first connection circuit;
a second connection circuit;
a second substrate that includes:
a transistor;
a first impedance converter between the first connection circuit and the transistor, wherein the first impedance converter is connected to the transistor, and
the first matching unit of the first substrate is connected to the first impedance converter via the first connection circuit; and
a second impedance converter between the transistor and the second connection circuit, wherein
the second impedance converter has a first end and a second end different from the first end,
the first end is connected to the transistor, and
the second end is connected to the second connection circuit; and
a third substrate that includes a second matching unit, wherein the second matching unit is connected to the second impedance converter via the second connection circuit.

2. The high-frequency amplifier according to claim 1, wherein
at least one of the first substrate or the third substrate includes a bias circuit, and
the bias circuit is connected to a corresponding matching unit in the at least one of the first substrate or the third substrate.

3. The high-frequency amplifier according to claim 1, wherein
the high-frequency amplifier satisfies at least one of $Re(Z1i) < Re(Z2i) < Re(Zin)$ or $Re(Z1o) < Re(Z2o) < Re(Zout)$, in a case where an input impedance of the transistor is set to Z1i, an output impedance of the transistor is Z1o, a first impedance at an end point on a second substrate side of the first connection circuit is Z2i, a second impedance at an end point on the second substrate side of the second connection circuit is Z2o, an input impedance of the high-frequency amplifier is Zin, and an output impedance of the high-frequency amplifier is Zout.

4. The high-frequency amplifier according to claim 3, wherein the high-frequency amplifier satisfies at least one of $0.1*Re(Zin) < Re(Z2i) < 0.9*Re(Zin)$ or $0.1*Re(Zout) < Re(Z2o) < 0.9*Re(Zout)$.

5. The high-frequency amplifier according to claim 2, wherein the bias circuit in the at least one of the first substrate or the third substrate is connected to a corresponding one of the first impedance converter or the second impedance converter via a bias connection.

6. The high-frequency amplifier according to claim 5, wherein the high-frequency amplifier satisfies at least one of $Re(1/Z1i) \leq Re(1/Z0i)$ or $Re(1/Z1o) \leq Re(1/Z0o)$, in a case where an input admittance of the transistor is 1/Z1i, an output admittance of the transistor is 1/Z1o, and a specific admittance at an end point on a second substrate side of the bias connection is one of 1/Z0i or 1/Z0o.

7. The high-frequency amplifier according to claim 6, wherein the high-frequency amplifier satisfies at least one of $Re(1/Z0i) > 2*Re(1/Zin)$ or $Re(1/Z0o) > 2*Re(1/Zout)$.

8. The high-frequency amplifier according to claim 1, wherein the first impedance converter includes:
a transmission line connected in series to the first connection circuit; and
a capacitive element connected in parallel with the first connection circuit.

9. An electronic device, comprising:
a high-frequency amplifier configured to:
receive an input signal; and
amplify the received input signal, wherein the high-frequency amplifier includes:
a first substrate that includes a first matching unit;
a first connection circuit;
a second connection circuit;
a second substrate that includes:
a transistor;
a first impedance converter between the first connection circuit and the transistor, wherein
the first impedance converter is connected to the transistor, and
the first matching unit is connected to the first impedance converter via the first connection circuit; and
a second impedance converter between the transistor and the second connection circuit, wherein
the second impedance converter has a first end and a second end different from the first end,
the first end is connected to the transistor, and
the second end is connected to the second connection circuit; and
a third substrate that includes a second matching unit, wherein the second matching unit is connected to the second impedance converter via the second connection circuit.

10. A communication device, comprising:
a high-frequency amplifier configured to amplify a transmission signal or a reception signal, wherein the high-frequency amplifier includes:
a first substrate that includes a first matching unit;
a first connection circuit;
a second connection circuit;
a second substrate that includes:
a transistor;
a first impedance converter between the first connection circuit and the transistor, wherein
the first impedance converter is connected to the transistor, and
the first matching unit is connected to the first impedance converter via the first connection circuit; and
a second impedance converter between the transistor and the second connection circuit, wherein
the second impedance converter has a first end and a second end different from the first end,
the first end is connected to the transistor, and
the second end is connected to the second connection circuit; and
a third substrate that includes a second matching unit, wherein the second matching unit is connected to the second impedance converter via the second connection circuit.

11. A high-frequency amplifier, comprising:
a first substrate that includes a first matching unit;
a second substrate that includes:
a transistor;
a first impedance converter connected to the transistor, wherein the first matching unit of the first substrate is connected to the first impedance converter via a first connection; and
a second impedance converter connected to the transistor; and
a third substrate that includes a second matching unit, wherein
the second matching unit is connected to the second impedance converter via a second connection, and
the high-frequency amplifier satisfies at least one of $Re(Z1i) < Re(Z2i) < Re(Zin)$ or $Re(Z1o) < Re(Z2o) < Re(Zout)$, in a case where an input impedance of the transistor is set to Z1i, an output impedance of the transistor is Z1o, a first impedance at an end point on a second substrate side of the first connection is Z2i, a second impedance at an end point on the second substrate side of the second connection is Z2o, an input impedance of the high-frequency amplifier is Zin, and an output impedance of the high-frequency amplifier is Zout.

* * * * *